US010991807B2

(12) United States Patent
Nam

(10) Patent No.: US 10,991,807 B2
(45) Date of Patent: Apr. 27, 2021

(54) SEMICONDUCTOR DEVICE HAVING GATE INSULATING LAYER

(71) Applicant: Samsung Electronics Co., Ltd., Suwon-si (KR)

(72) Inventor: Ki Hyung Nam, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/351,957

(22) Filed: Mar. 13, 2019

(65) Prior Publication Data

US 2020/0091303 A1 Mar. 19, 2020

(30) Foreign Application Priority Data

Sep. 19, 2018 (KR) ........................ 10-2018-0112421

(51) Int. Cl.

| | |
|---|---|
| ***H01L 29/66*** | (2006.01) |
| ***H01L 29/423*** | (2006.01) |
| ***H01L 29/49*** | (2006.01) |
| ***H01L 29/78*** | (2006.01) |

(52) U.S. Cl.
CPC ...... *H01L 29/4236* (2013.01); *H01L 29/4916* (2013.01); *H01L 29/7827* (2013.01)

(58) Field of Classification Search
USPC .......................... 257/330, 204, 369; 438/283
See application file for complete search history.

(56) References Cited

U.S. PATENT DOCUMENTS

| | | | | |
|---|---|---|---|---|
| 6,310,375 | B1 | 10/2001 | Schrems | |
| 7,276,411 | B2 | 10/2007 | Williams et al. | |
| 7,531,438 | B2 | 5/2009 | Chou et al. | |
| 8,420,484 | B2 | 4/2013 | Yoo | |
| 8,497,549 | B2 | 7/2013 | Madson | |
| 8,735,906 | B2 | 5/2014 | Nakano | |
| 9,136,270 | B2 | 9/2015 | Kim et al. | |
| 9,287,159 | B2 | 3/2016 | Kim et al. | |
| 9,755,066 | B2 | 9/2017 | Laforet et al. | |
| 9,978,847 | B2 | 5/2018 | Delalleau et al. | |
| 2015/0349073 | A1* | 12/2015 | Kang | H01L 27/10891 257/330 |
| 2016/0172488 | A1* | 6/2016 | Oh | H01L 21/28088 257/330 |

FOREIGN PATENT DOCUMENTS

KR 10-2014-005373 A 5/2014

* cited by examiner

*Primary Examiner* — Niki H Nguyen
(74) *Attorney, Agent, or Firm* — Harness, Dickey & Pierce, P.L.C.

(57) ABSTRACT

A semiconductor device includes gate trench, an upper gate insulating layer on an inner surface of an upper region of the gate trench, a lower gate insulating layer on an inner surface and a lower surface of a lower region of the gate trench and connected to the upper gate insulating layer, a first gate barrier layer on an inner side of the lower gate insulating layer, a gate electrode on an inner side of the first gate barrier layer and configured to fill the lower region of the gate trench, and a gate buried portion on the gate electrode. A diameter of an inner circumference of an upper end of the lower gate insulating layer is greater than a diameter of an inner circumference of a lower end of the upper gate insulating layer.

20 Claims, 13 Drawing Sheets

130
110b
110a
112
128
124
126
122
114
104

SEMICONDUCTOR DEVICE HAVING GATE INSULATING LAYER

CROSS-REFERENCE TO RELATED APPLICATION

This application claims from Korean Patent Application No. 10-2018-0112421, filed on Sep. 19, 2018, the disclosure of which is incorporated herein by reference in its entirety.

BACKGROUND

Devices consistent with example embodiments relate to a semiconductor device having a gate insulating layer.

Due to demands for compact and lightweight semiconductor devices, circuit patterns of the semiconductor devices are being reduced in size, e.g. miniaturized. Accordingly, a buried cell array transistor (BCAT) structure has been proposed in which gate electrodes are formed in a semiconductor substrate in order to increase a channel length of a transistor. However, when patterns are further reduced in size with a reduction in design rules, sizes of the gate electrodes are reduced, and thus gate resistance may be increased.

SUMMARY

Example embodiments of inventive concepts are directed to providing a semiconductor device having an upper gate insulating layer and a lower gate insulating layer on an inner wall of a gate trench, wherein an inner diameter of an upper end of the lower gate insulating layer is greater than an inner diameter of a lower end of the upper gate insulating layer.

According to some example embodiments, there is provided a semiconductor device which includes a substrate including an upper surface; a gate trench on the upper surface of the substrate, the gate trench including an upper region and a lower region, the upper region of the gate trench including a first inner surface, the lower region of the gate trench including a second inner surface and a lower surface; an upper gate insulating layer on the first inner surface; a lower gate insulating layer on the second inner surface and the lower surface, the lower gate insulating layer connected to the upper gate insulating layer; a first gate barrier layer on a first inner side of the lower gate insulating layer; a gate electrode on a second inner side of the first gate barrier layer, the gate electrode filling the lower region of the gate trench; a gate buried portion on the gate electrode; and a gate capping layer on the gate buried portion. A diameter of an inner circumference of an upper end of the lower gate insulating layer is greater than a diameter of an inner circumference of a lower end of the upper gate insulating layer.

According to some example embodiments, there is provided a semiconductor memory device which includes a substrate including an upper surface; a gate trench on the upper surface of the substrate, the gate trench including an upper region and a lower region, the upper region including a first inner surface, the lower region including a second inner surface; an upper gate insulating layer on the first inner surface of the upper region of the gate trench; a lower gate insulating layer on a.) the second inner surface of the lower region of the gate trench and b.) a lower surface of the lower region of the gate trench, the lower gate insulating layer connected to the upper gate insulating layer; a first gate barrier layer on an inner side of the lower gate insulating layer; a gate electrode on an inner side of the first gate barrier layer, the gate electrode filling the lower region of the gate trench; a gate buried portion on the gate electrode; and a gate capping layer on the gate buried portion. A diameter of an outer circumference of an upper end of the first gate barrier layer is greater than a diameter of a lower surface of the gate buried portion.

According to some example embodiments, there is provided a semiconductor memory device which includes a substrate comprising an active region; a gate trench configured to extend in one direction on an upper surface of the substrate; an upper gate insulating layer on an inner surface of an upper region of the gate trench; a lower gate insulating layer on a.) an inner surface of a lower region of the gate trench and b.) a lower surface of a lower region of the gate trench, the lower gate insulating layer connected to the upper gate insulating layer; a first gate barrier layer on an inner side of the lower gate insulating layer; a gate electrode on an inner side of the first gate barrier layer, the gate electrode configured to fill the lower region of the gate trench; a second gate barrier layer; a gate buried portion, the second gate barrier layer and the gate buried portion being sequentially stacked on the gate electrode; and a gate capping layer on the gate buried portion. The upper gate insulating layer and the lower gate insulating layer are in the active region, an upper end of the first gate barrier layer is positioned at the same level as an upper surface of the gate electrode, a lower surface of the second gate barrier layer is positioned at the same level as a lower end of the lower gate insulating layer are positioned, and a diameter of an inner circumference of an upper end of the lower gate insulating layer is greater than a diameter of an inner circumference of a lower end of the upper gate insulating layer.

DETAILED DESCRIPTION

Figure 1:
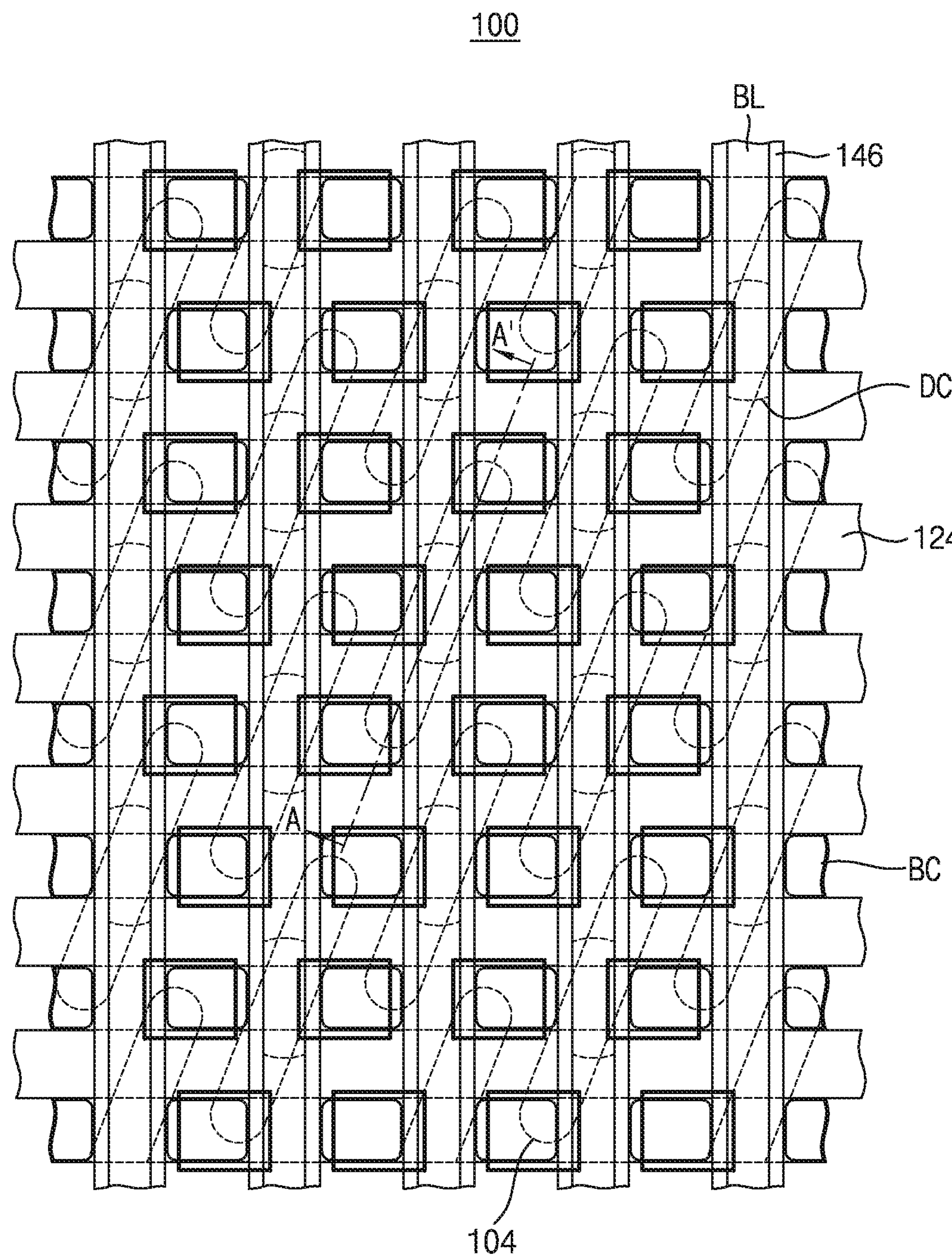
FIG. 1 is a plan view of a semiconductor device, according to some example embodiments of inventive concepts.
Figure 2:
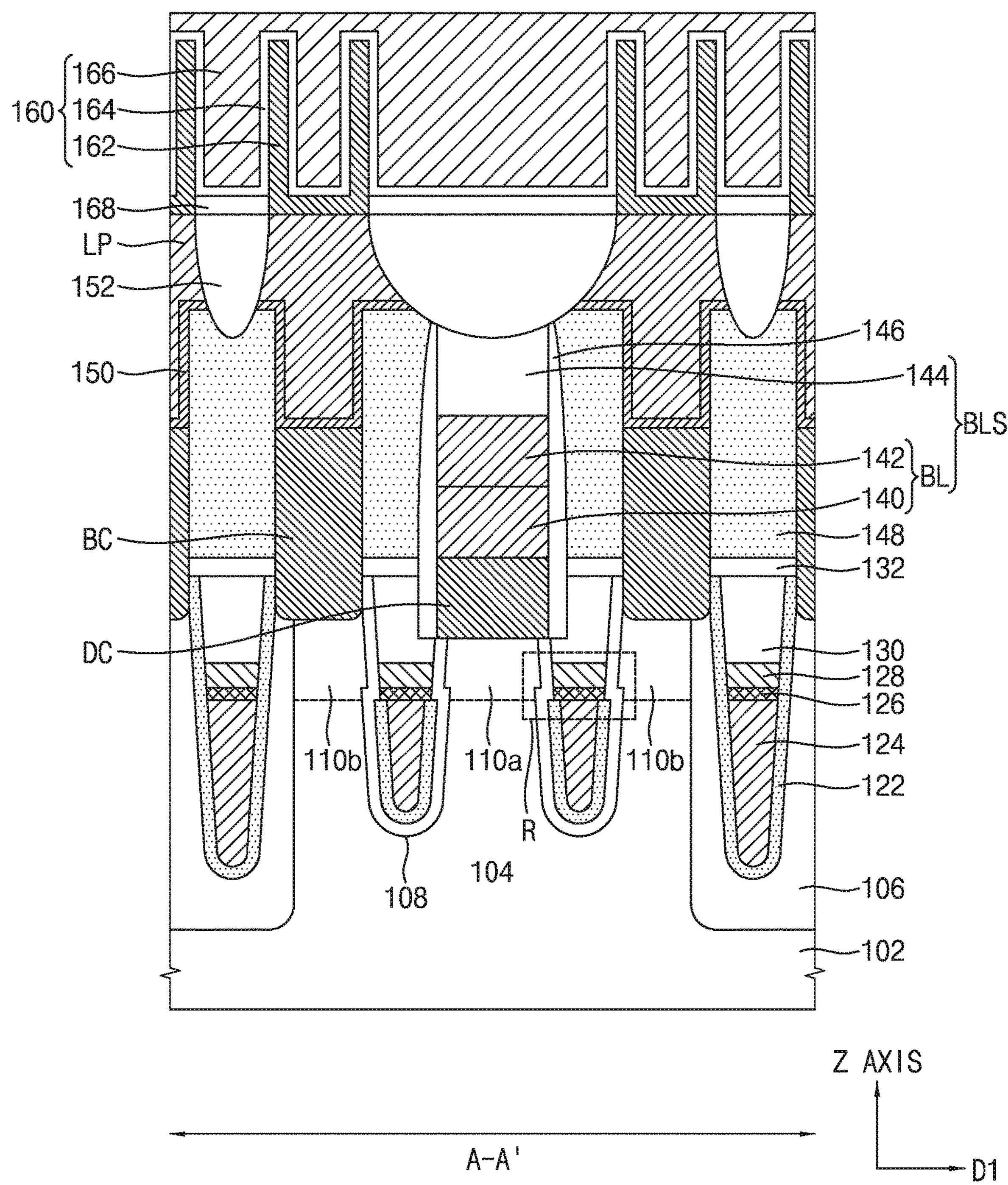
FIG. 2 is a vertical sectional view taken along line A-A' of FIG. 1.

FIG. 1 is a plan view of a semiconductor device according to an example embodiment of inventive concepts. FIG. 2 is a vertical sectional view taken along line A-A' of FIG. 1.

Referring to FIGS. 1 and 2, active regions 104 of a substrate 102 may be defined by a device isolation layer 106. The substrate 102 may include a semiconductor material. For example, the substrate may be or include a silicon substrate, a germanium substrate, a silicon germanium substrate, and/or a silicon-on-insulator (SOI) substrate. The substrate 102 may include impurities; for example, the substrate 102 may be lightly doped with boron, and may have a P-type conductivity; however, inventive concepts are not limited thereto.

The active regions 104 may have a bar shape elongated in a direction D1, and the active regions 104 may be disposed at regular intervals to be isolated from each other. For example, the active regions 104 may be disposed parallel to each other in the direction D1. The direction D1 may correspond to a direction at an angle relative to an X-axis and a Y-axis of a surface of the substrate 102. For example, the direction D1 may correspond to an angle of about 70 degrees from the X-axis; however, inventive concepts are not limited thereto. Impurity regions 110*a* and 110*b* may be disposed in the active regions 104. The impurity regions 110*a* and 110*b* may have an N-type conductive type and may be doped/implanted with phosphorous (P) and/or arsenic (As); however, inventive concepts are not limited thereto. The device isolation layer 106 may have a shallow trench isolation (STI) structure and may include an insulating material. For example, the device isolation layer 106 may include silicon oxide ($SiO_2$). A photolithographic process may be used to pattern and etch the substrate 102 to form the active regions 104 by etching out the device isolation layer 106, and the device isolation layer 106 may be filled with the silicon oxide layer, using a process such as spin-on dielectric deposition (SOD deposition) and/or high density plasma deposition (HDP deposition); however, inventive concepts are not limited thereto.

Figure 3:
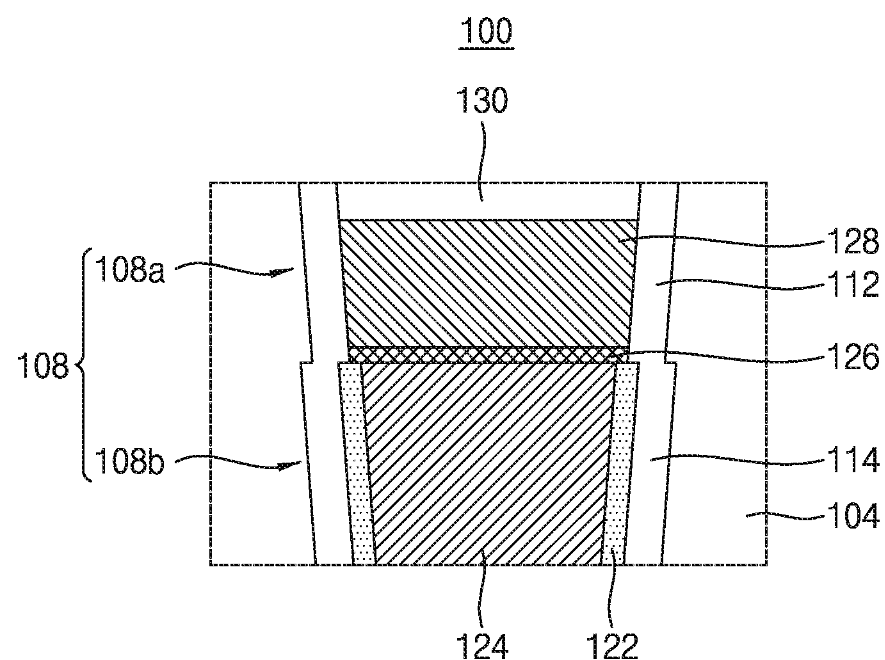
FIG. 3 is an enlarged view showing a portion of a gate trench, according to some example embodiment of inventive concepts.

A gate trench 108 may be formed to have a predetermined (or, alternatively, variable) depth from an upper surface of the substrate 102 (see FIG. 3). The gate trench 108 may be formed to intersect the active regions 104, and may extend in the X-axis direction. For example, two gate trenches 108 may be disposed to intersect one active region 104. An angle of intersection, when viewed in a plan view, may be about 70 degrees; however, inventive concepts are not limited thereto. The gate trenches 108 may be disposed to be spaced a distance from each other in the Y-axis direction, e.g. a distance determined by a pitch corresponding to design rules of a fabrication process of the semiconductor device 100. A portion of the gate trench 108 may intersect the device isolation layer 106, and the gate trench 108 formed in the device isolation layer 106 may be formed deeper than the gate trench 108 formed in the active region 104.

The impurity regions 110*a* and 110*b* may be disposed on an upper portion of the active region 104 which does not intersect the gate trench 108. The impurity regions 110*a* and 110*b* may be formed by doping impurities such as As and/or P on the upper surface of the substrate 102. Lower ends of the impurity regions 110*a* and 110*b* may be positioned at a higher level than a lower end of the gate trench 108. The impurity region 110*a* may correspond to a source region and the impurity region 110*b* may correspond to a drain region. A well region (not shown) may be formed by implanting the substrate 102 with doping impurities such as boron (B). The well region may have an opposite conductivity type to the impurity regions 110*a* and 110*b*. A junction may be formed between the well region and the impurity regions 110*a* and 110*b*. The lower ends of the impurity regions 110*a* and 110*b* may correspond to the junction between the impurity regions 110*a* and 110*b* and the well region.

An upper gate insulating layer 112, a lower gate insulating layer 114, a gate structure, and a gate capping layer 130 may be disposed inside the gate trench 108 which intersects the active region 104 (see FIG. 3). The gate structure may include a first gate barrier layer 122, a gate electrode 124, a second gate barrier layer 126, and a gate buried portion 128. The portions of the gate trench 108 which intersects the device isolation layer 106 may not include the upper gate insulating layer 112 and the lower gate insulating layer 114. The gate electrode 124 may extend along the gate trench 108 in the X-axis direction. The gate electrode 124 may be referred to as a word line, and may correspond to a row of the semiconductor device 100. The upper gate insulating layer 112 and the lower gate insulating layer 114 may correspond to a gate dielectric for the semiconductor device 100.

A first insulating pattern 132 may be disposed on the upper surface of the substrate 102. The first insulating pattern 132 may cover an upper surface of the gate capping layer 130. The first insulating pattern 132 may include silicon oxide ($SiO_2$), silicon nitride ($Si_3N_4$), silicon oxynitride, or a combination thereof, and may be formed as a single layer or multiple layers. The first insulating pattern 132 may be formed with a chemical vapor deposition (CVD) process such as a plasma enhanced chemical vapor deposition (PECVD) process; however, inventive concepts are not limited thereto.

A bit line contact plug DC may be disposed on the impurity region 110*a* to pass through the first insulating pattern 132. The upper surface of the substrate 102 may be recessed such that a lower surface of the bit line contact plug DC is positioned at a lower level than the upper surface of the substrate 102. The bit line contact plug DC may have a horizontal width greater than a horizontal width of the impurity region 110*a* and may be electrically connected to the impurity region 110*a*. The bit line contact plug DC may include a conductive material and may include, for example, polysilicon (e.g. doped polysilicon), a metal, and/or a metal silicide.

A bit line structure BLS may include a bit line BL and a second insulating pattern 144 which are stacked, e.g. sequentially stacked, on the bit line contact plug DC. The bit line structure BLS may extend in the Y-axis direction, which is a direction intersecting the gate electrode 124. The bit line BL may include a first conductive pattern 140 and a second conductive pattern 142 disposed on the first conductive pattern 140. The first conductive pattern 140 may include doped polysilicon and the second conductive pattern 142 may include at least one of tungsten (W), aluminum (Al), copper (Cu), nickel (Ni), and cobalt (Co). The second insulating pattern 144 may be disposed on the second conductive pattern 142 and may include silicon nitride and/or silicon oxynitride.

A bit line spacer 146 may be formed on side surfaces of the bit line contact plug DC and the bit line structure BLS and may be a pair of structures facing each other with the bit line contact plug DC and the bit line structure BLS interposed therebetween. The bit line spacer 146 may have a structure having a single layer or multiple layers and may include silicon oxide, silicon nitride, and/or silicon oxynitride. The bit line spacer 146 may further include an air gap therein; however, inventive concepts are not limited thereto.

Storage node contacts BC may be disposed between the bit lines BL and may be on both ends of the active region 104. The storage node contact BC may be formed to pass through the first insulating pattern 132 and may be electrically connected to the impurity region 110*b*. An upper surface of the storage node contact BC may be positioned at a higher level than an upper surface of the first insulating pattern 132. The storage node contact BC may include polysilicon, e.g. doped polysilicon.

A third insulating pattern 148 may be disposed between the storage node contacts BC on the first insulating pattern 132. The third insulating pattern 148 may electrically insulate the storage node contacts BC from each other. An upper surface of the third insulating pattern 148 may be positioned at a higher level than the upper surface of the storage node contact BC. The third insulating pattern 148 may include, for example, any one of SiBCN, SiCN, SiOCN, and SiN; however, inventive concepts are not limited thereto. The third insulating pattern 148 may be formed with a CVD process such as a PECVD process; however, inventive concepts are not limited thereto.

A barrier pattern 150 may be disposed on the storage node contacts BC and the third insulating pattern 148, and landing pads LP may be disposed on the barrier pattern 150. Although not shown, a metal silicide may be disposed between the barrier pattern 150 and the storage node contact BC. The barrier pattern 150 may protect the storage node contacts BC in a process of forming the landing pad LP. The barrier pattern 150 may include TiN, Ti/TiN, TiSiN, TaN, or WN. The landing pad LP may include tungsten. The barrier pattern 150 may be formed with a physical vapor deposition (PVD) process and/or a CVD process. The landing pad LP may be formed with a PVD process and/or a CVD process.

A fourth insulating pattern 152 may be disposed between the landing pads LP. A lower end of the fourth insulating pattern 152 may be connected to the third insulating pattern 148 to pass through the barrier pattern 150. An upper surface of the fourth insulating pattern 152 may be positioned at the same level as an upper surface of the landing pad LP. The fourth insulating pattern 152 may separate the landing pads LP in the X-axis direction and in the Y-axis direction and may electrically insulate the landing pads LP from each other. The fourth insulating pattern 152 may be formed by recessing the upper surface of the landing pad LP and filling a recessed portion with an insulating material. The fourth insulating pattern 152 may include silicon oxide, silicon nitride, and/or silicon oxynitride; however, inventive concepts are not limited thereto. The fourth insulating pattern may be formed with a CVD process.

A capacitor 160 may be disposed on the landing pad LP. The capacitor 160 may be misaligned with the storage node contact BC in the X-axis direction and/or in the Y-axis direction. The capacitor 160 may include a lower electrode 162, a dielectric film 164, and an upper electrode 166. An etch stop film 168 may be disposed between the capacitors 160. The lower electrode 162 may have a cylindrical shape, but inventive concepts is not limited thereto, and the lower electrode 162 may have a pillar shape. The lower electrode 162 may be electrically connected to the landing pad LP and may include a metal such as Ti or W, a metal nitride such as TiN or, WN, or the like; however, inventive concepts are not limited thereto. The dielectric film 164 may be conformally disposed on surfaces of the lower electrode 162 and the etch stop film 168 and may cover, for example, an upper surface and side surfaces of the lower electrode 162 and an upper surface of the etch stop film 168. The dielectric film 164 may include a metal oxide having a high dielectric constant, such as hafnium oxide ($HfO_x$), zirconium oxide ($ZrO_x$), and/or the like. The dielectric film 164 may be formed with a CVD process such as an atomic layer deposition (ALD) process; however, inventive concepts are not limited thereto. The upper electrode 166 may be disposed on the dielectric film 164 and may include a metal such as Ti, W, Ta, or Ru, a metal nitride such as WN or TaN, and/or the like. The etch stop film 168 may be disposed on the fourth insulating pattern 152 and may electrically insulate the capacitors 160 from each other. The etch stop film 168 may include silicon nitride and/or silicon oxynitride.

FIG. 3 is an enlarged view showing a portion of a gate trench according to an example embodiment of inventive concepts. FIGS. 3-12 correspond to a region R of FIG. 2.

Referring to FIG. 3, a semiconductor device 100 may include an upper gate insulating layer 112, a lower gate insulating layer 114, a first gate barrier layer 122, a gate electrode 124, a second gate barrier layer 126, a gate buried portion 128, and a gate capping layer 130, which are disposed in a gate trench 108.

The upper gate insulating layer 112 and the lower gate insulating layer 114 may be formed on an inner wall of the gate trench 108 and may include silicon oxide. The upper gate insulating layer 112 may be formed by performing CVD process and a silicon oxidation process, such as in-situ steam generation (ISSG), to be described in more detail below with reference to FIG. 16. The lower gate insulating layer 114 may be formed by a silicon oxidation process, such as an ISSG oxidation, to be described in more detail below with reference to FIG. 16.

An inner diameter of an upper end of the lower gate insulating layer 114 may be greater than an inner diameter of a lower end of the upper gate insulating layer 112. The upper end of the lower gate insulating layer 114 may contact the lower end of the upper gate insulating layer 112. In some example embodiments, an outer diameter of the upper end of the lower gate insulating layer 114 may be greater than an outer diameter of the lower end of the upper gate insulating layer 112. A step may be formed between the upper gate insulating layer 112 and the lower gate insulating layer 114 at an inner side of the gate trench 108. In some example embodiments, a step may be formed between the upper gate insulating layer 112 and the lower gate insulating layer 114 at an outer side of the gate trench 108. The upper gate insulating layer 112 and the lower gate insulating layer 114 may be integrally formed, e.g. formed at the same time.

Due to reduction in sizes of semiconductor devices, widths of gate trenches and a gap between the gate trenches become narrower and a space filled with a gate electrode becomes smaller, thereby causing a problem of increasing gate resistance. However, in the semiconductor device 100 according to inventive concepts, a lower region **108*b* of the gate trench 108 may be formed to be relatively wide to secure a space filled with the gate electrode 124**, and thus an increase in gate resistance may be prevented or reduced in likelihood of occurrence.

Hereinafter, an upper region **108*a* of the gate trench 108 may refer to a portion in which the upper gate insulating layer 112 is positioned. A lower region 108*b* of the gate trench 108 may be a portion of the gate trench 108 excluding the upper region 108*a* and may refer to a portion in which the lower gate insulating layer 114** is positioned.

The first gate barrier layer 122 may be disposed on the lower gate insulating layer 114. The first gate barrier layer 122 may be disposed between the gate electrode 124 and the lower gate insulating layer 114 and may be positioned in the lower region **108*b* of the gate trench 108. The first gate barrier layer 122 may improve adhesion of the gate electrode 124 and prevent or reduce diffusion of a metal material. Further, the first gate barrier layer 122 may prevent or reduce reaction between tungsten hexafluoride ($WF_6$) gas, which is a precursor of tungsten, and silicon oxide, when tungsten (W) is used for the gate electrode 124. For example, the first gate barrier layer 122** may include titanium nitride (TiN) and/or tantalum nitride (TaN).

The gate electrode 124 may be disposed on the first gate barrier layer 122. The gate electrode 124 may fill the lower region **108*b* of the gate trench 108. An upper surface of the gate electrode 124 may be positioned at the same level as an upper surface of the first gate barrier layer 122 and may be positioned below the upper gate insulating layer 112. The gate electrode 124** may include a metal such as tungsten and/or copper. The gate electrode may be formed with a CVD process, a PVD process, or any process suitable for filling a trench with a metal such as tungsten and/or copper.

The second gate barrier layer 126 may be disposed between the gate electrode 124 and the gate buried portion 128. Further, the second gate barrier layer 126 may be in contact with an inner wall of the upper gate insulating layer 112 and may be disposed in the upper region 108*a* of the gate trench 108. A portion of the second gate barrier layer 126 may be in contact with the first gate barrier layer 122. The second gate barrier layer 126 may be formed to have a small thickness. The second gate barrier layer 126 may prevent or reduce tungsten and polysilicon from reacting to form WSi, by inter diffusion from polysilicon to tungsten. The second gate barrier layer 126 may include titanium nitride (TiN), tantalum nitride (TaN), and/or tungsten nitride (WN).

The gate buried portion 128 may be disposed between the second gate barrier layer 126 and the gate capping layer 130. The gate buried portion 128 may have a low work function and may include, for example, n+ doped polysilicon having a low work function.

Generally, as a width of the gate trench 108 decreases, a distance between active regions 104 decreases, and thus a gate-induced drain leakage (GIDL) current may be generated. The GIDL current may impact refresh performance of the semiconductor device 100. However, in the semiconductor device 100 according to inventive concepts, the gate buried portion 128 positioned above the gate electrode 124 close to the active region 104 may include n+ doped polysilicon having a low work function, and thus a GIDL may be reduced or prevented. As a result, a refresh speed of a memory may be increased and thus a semiconductor device which operates at a high speed may be implemented.

The gate capping layer 130 may be disposed on the gate buried portion 128. The gate capping layer 130 may fill the upper region 108*a* of the gate trench 108. An upper surface of the gate capping layer 130 may be positioned at the same level as an upper surface of a substrate 102. The gate capping layer 130 may include silicon nitride, silicon oxynitride, or a combination thereof.

FIGS. 4 to 12 are enlarged views of gate trenches according to some example embodiments of inventive concepts.

Figure 4:
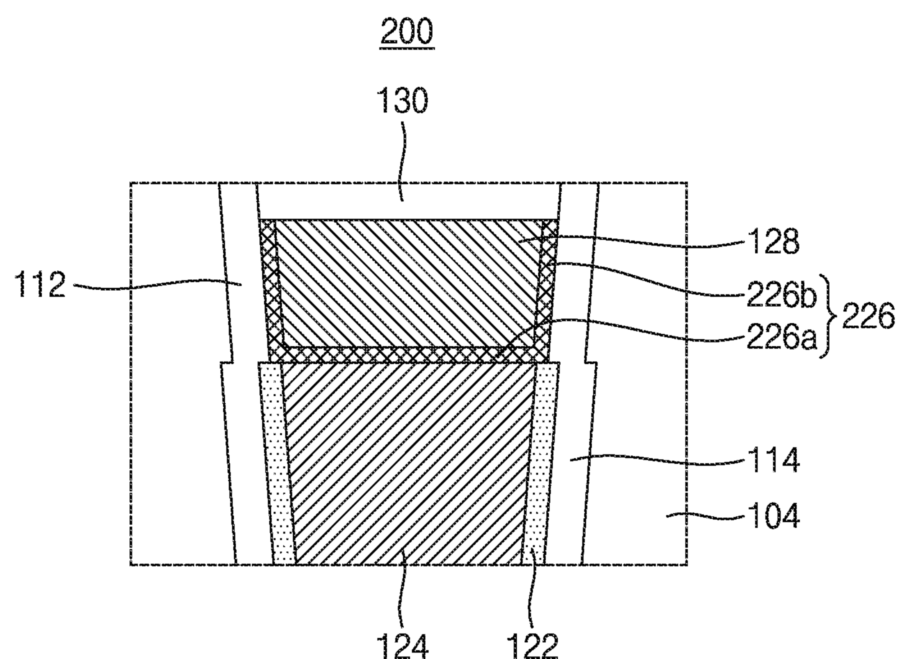
FIGS. 4 to 12 are enlarged views of gate trenches, according to some example embodiment of inventive concepts.

Referring to FIG. 4, a semiconductor device 200 may include a second gate barrier layer 226. The second gate barrier layer 226 may include a bottom portion 226*a* and a side portion 226*b*. The bottom portion 226*a* may be disposed on a gate electrode 124, and the side portion 226*b* may be disposed between an upper gate insulating layer 112 and a gate buried portion 128 and may be in contact with the bottom portion 226*a*. An upper surface of the side portion 226*b* may be positioned at the same level as an upper surface of the gate buried portion 128. The bottom portion 226*a* and the side portion 226*b* may be integrally formed, that is, formed at the same time. In a process for forming the gate buried portion 128, a barrier material may be formed on an inner wall of a gate trench 108 and on the gate electrode 124, the gate buried portion 128 may be deposited on the barrier material, and then the second gate barrier layer 226 may be formed by an etch-back process.

Figure 5:
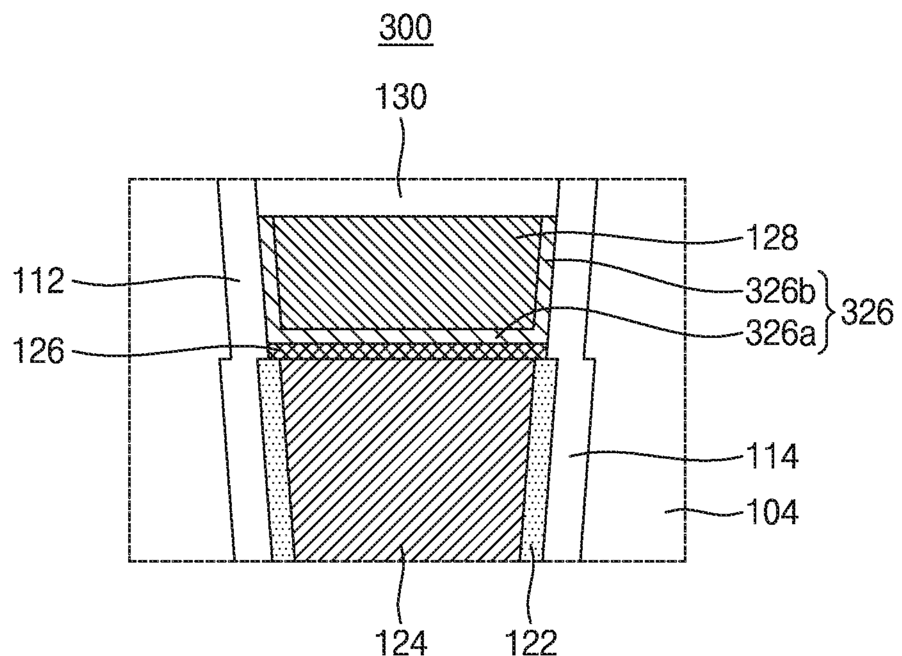

Referring to FIG. 5, a semiconductor device 300 may include a work function adjusting layer 326. The work function adjusting layer 326 may include a bottom portion 326*a* and a side portion 326*b*. The bottom portion 326*a* may be disposed on a second gate barrier layer 126, and the side portion 326*b* may be disposed between an upper gate insulating layer 112 and a gate buried portion 128 and may be in contact with the bottom portion 326*a*. An upper surface of the side portion 326*b* may be positioned at the same level as an upper surface of the gate buried portion 128. The bottom portion 326*a* and the side portion 326*b* may be integrally formed.

Figure 6:
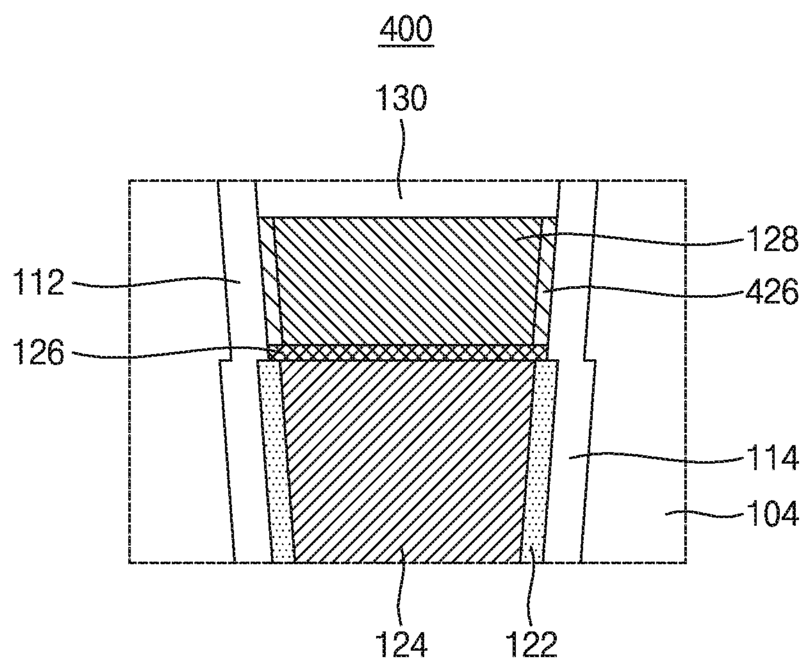

Referring to FIG. 6, a semiconductor device 400 may include a work function adjusting layer 426. The work function adjusting layer 426 may be disposed between an upper gate insulating layer 112 and a gate buried portion 128. An upper end of the work function adjusting layer 426 may be positioned at the same level as an upper surface of the gate buried portion 128, and a lower end of the work function adjusting layer 426 may be in contact with a second gate barrier layer 126.

As shown in FIGS. 5 and 6, the work function adjusting layers 326 and 426 may be disposed on side surfaces or a lower surface of the gate buried portion 128. The work function adjusting layers 326 and 426 may include a metal such as Ti, TiN, TiAlN, TiAlC, TiAlCN, TiSiCN, Ta, TaN, TaAlN, TaAlCN, TaSiCN, and/or the like, a metal nitride, and/or a metal carbide. Since the work function adjusting layers 326 and 426 have a relatively low work function, the work function adjusting layers 326 and 426 may be disposed on the side surfaces or the lower surface of the gate buried portion 128 and thus a GIDL may be prevented.

Figure 7:
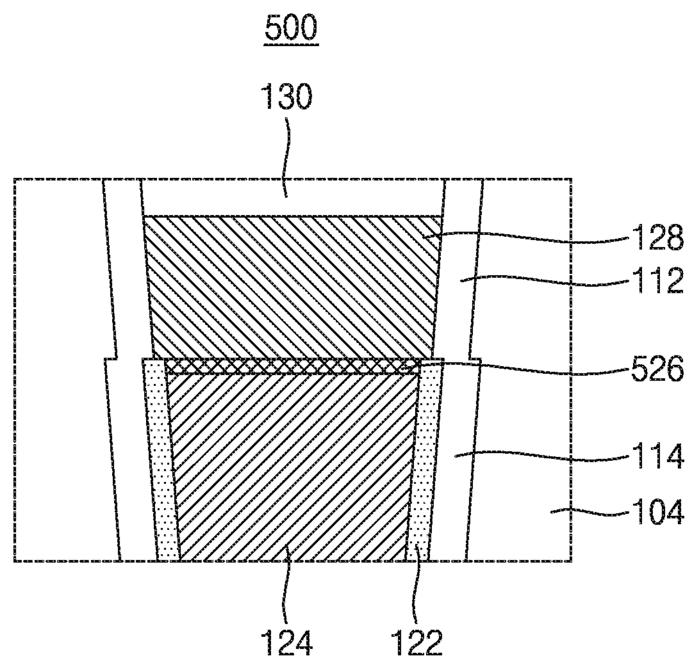

Referring to FIG. 7, a semiconductor device 500 may include a second gate barrier layer 526. The second gate barrier layer 526 may be disposed on a lower region 108*b* of a gate trench 108. For example, the second gate barrier layer 526 may be positioned between a gate electrode 124 and a gate buried portion 128 and may be in contact with an inner wall of a first gate barrier layer 122. The second gate barrier layer 526 may be formed by performing an ion implantation process on the gate electrode 124. In some example embodiments, the gate electrode 124 may include tungsten and the second gate barrier layer 526 may include tungsten nitride. As shown in more detail in FIG. 20, a nitride ion implantation process may be performed on the recessed gate electrode 124, for example a nitride ion implantation process that includes a shallow implantation of nitride into the recessed gate electrode 124. The second gate barrier layer 526 may be formed from above the gate electrode 124 using the ion implantation process.

Figure 8:
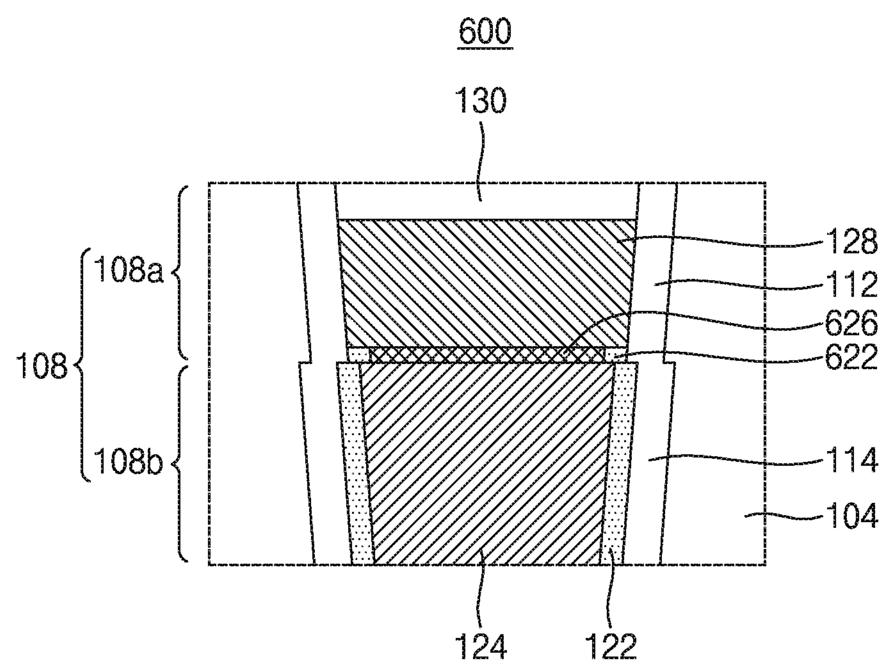

Referring to FIG. 8, a semiconductor device 600 may include a first gate barrier layer 122 and a second gate barrier layer 626. The first gate barrier layer 122 may include a protrusion 622 at an upper portion thereof, and the protrusion 622 may be positioned in an upper region 108*a* of a gate trench 108. The second gate barrier layer 626 may be disposed in the upper region 108*a* of the gate trench 108. For example, the second gate barrier layer 626 may be positioned between a gate electrode 124 and a gate buried portion 128 and may be in contact with a side surface of the first gate barrier layer 122.

In a recessing process (see FIG. 19) to be described in more detail below, portions of the first gate barrier layer 122 and the gate electrode 124 may be positioned in the upper region 108*a* of the gate trench 108. Thereafter, the second gate barrier layer 626 may be formed by performing an ion implantation process on the portion of the gate electrode 124 positioned in the gate trench 108. The gate electrode 124 may be recessed so that the portion of the gate electrode 124 remains in the upper region 108*a* of the gate trench 108, and thus an amount of the gate electrode 124, which is converted into the second gate barrier layer 626, may be compensated for by the ion implantation process. With the above method, the amount of the gate electrode 124 which fills an inside of the gate trench 108 is increased, and thus an increase in gate resistance may be prevented and/or the gate resistance may be reduced.

Figure 9:
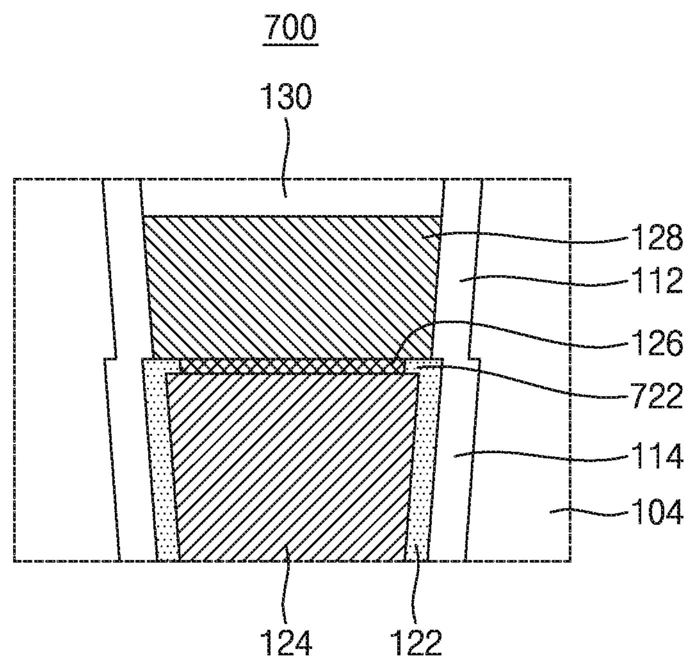

Referring to FIG. 9, a semiconductor device 700 may include a first gate barrier layer 122. The first gate barrier layer 122 may include a protrusion 722 at an upper end thereof. The protrusion 722 may be positioned in a lower region 108*b* of a gate trench 108. A second gate barrier layer 126 may be disposed in the lower region 108*b* of the gate trench 108. For example, the second gate barrier layer 126 may be positioned between a gate electrode 124 and a gate buried portion 128 and may be in contact with a side surface of the protrusion 722.

In a deposition process (see FIG. 18) to be described below, the first gate barrier layer 122 may be conformally deposited at inner sides of an upper gate insulating layer 112 and a lower gate insulating layer 114. A portion of an upper portion of the first gate barrier layer 122 may be removed by the recessing process, and the first gate barrier layer 122 having the protrusion 722 may be formed.

Figure 10:
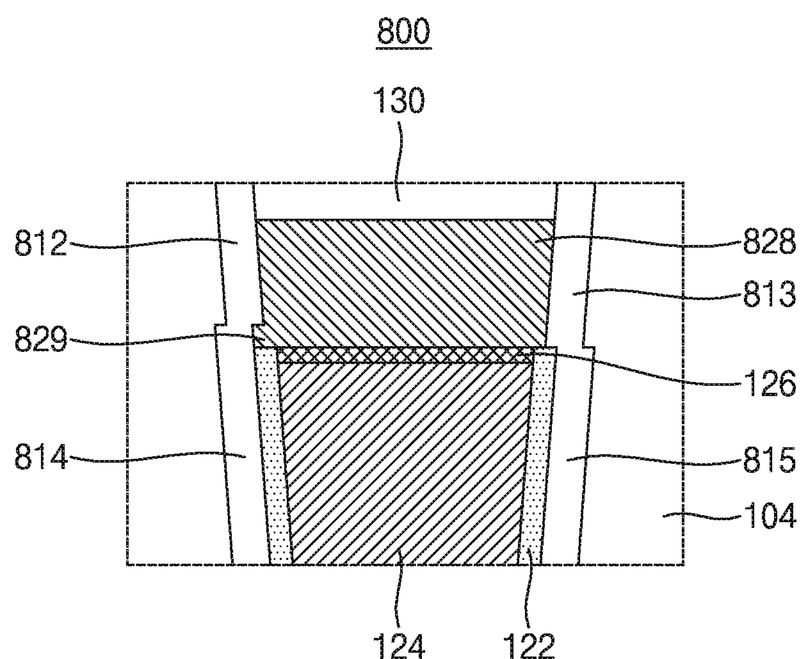

Referring to FIG. 10, a semiconductor device 800 may include upper gate insulating layers 812 and 813, lower gate insulating layers 814 and 815, and a gate buried portion 828. The upper gate insulating layer 812 and the upper gate insulating layer 813 may have different heights in a cross-sectional view thereof. For example, a lower end of the upper gate insulating layer 812 may be positioned at a higher level than a lower end of the upper gate insulating layer 813. The lower gate insulating layer 814 and the lower gate insulating layer 815 may have different heights in a cross-sectional view thereof. For example, an upper end of the lower gate insulating layer 814 may be positioned a higher level than an upper end of the lower gate insulating layer 815. Upper surfaces of the first gate barrier layer 122 and the second gate barrier layer 126 may be positioned at the same level as an upper surface of the lower gate insulating layer 815. The gate buried portion 828 may fill a portion of the gate trench 108 between the first gate barrier layer 122, the second gate barrier layer 126, and the gate capping layer 130. The gate buried portion 828 may include a protrusion 829 protruding outward. In an etching process (see FIG. 15) to be described in more detail below, an insulating layer positioned at an inner wall of the gate trench 108 may be asymmetrically etched. Thereafter, an oxidation process may be performed to form the upper gate insulating layers 812 and 813 and the lower gate insulating layers 814 and 815 having different heights as shown in FIG. 10.

Figure 11:
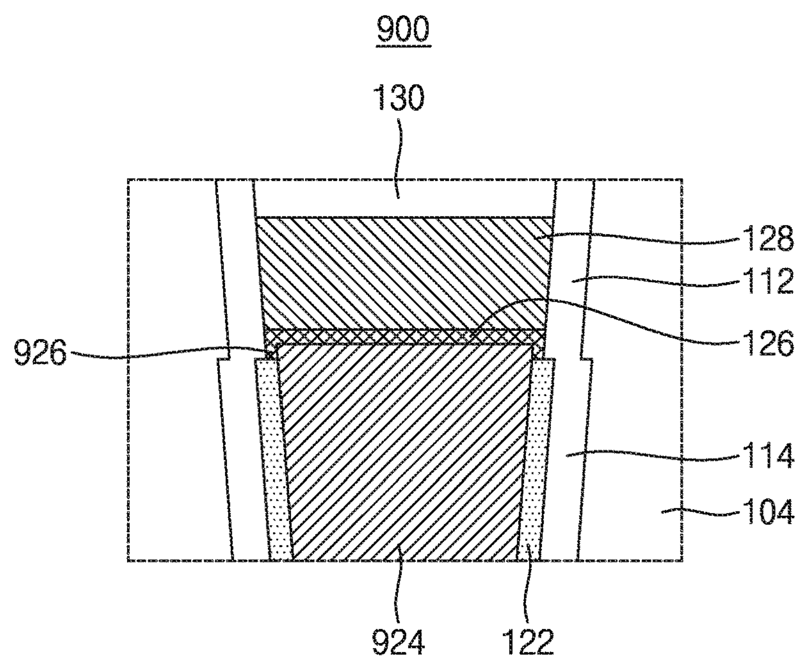

Referring to FIG. 11, a semiconductor device 900 may include a gate electrode 924 and a second gate barrier layer 126. An upper surface of the gate electrode 924 may be positioned at a higher level than an upper end of a first gate barrier layer 122. The second gate barrier layer 126 may include a protrusion 926. The protrusion 926 may be formed along an outer circumference of the second gate barrier layer 126. The protrusion 926 may be in contact with an inner surface of an upper gate insulating layer 112 and an outer surface of the gate electrode 924. Further, the protrusion 926 may be in contact with an upper end of the first gate barrier layer 122.

Figure 12:
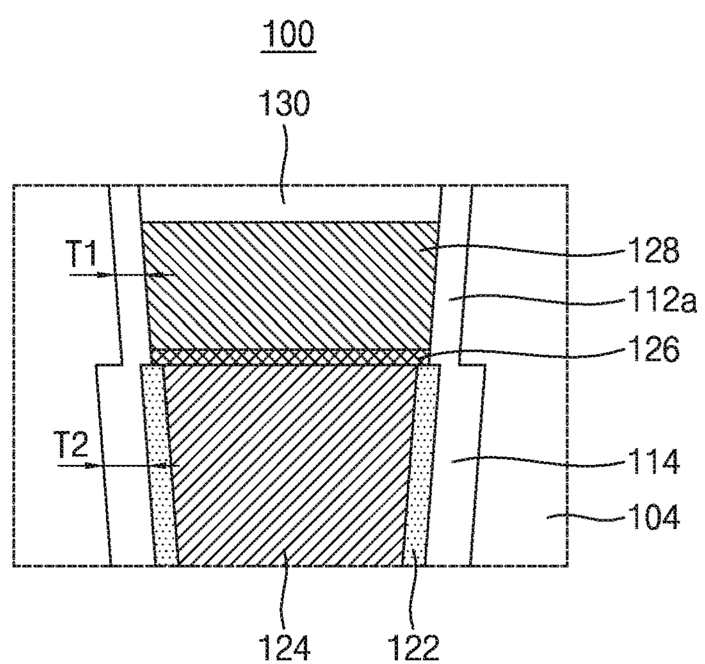

FIG. 12 shows an upper gate insulating layer 112*a* according to an example embodiment, which corresponds to that of the semiconductor device 100 of FIG. 3. A thickness T1 of the upper gate insulating layer 112*a* may be smaller than a thickness T2 of a lower gate insulating layer 114. In a process of forming a first gate barrier layer 122, a gate electrode 124, a second gate barrier layer 126, and a gate buried portion 128 inside a gate trench 108, a recessing process may be performed a plurality of times. A portion of a side surface of an upper gate insulating layer 112 may be etched by the recessing process, and thus the upper gate insulating layer 112*a* may be formed to have a thickness less than that of the lower gate insulating layer 114.

FIGS. 13 to 16 and 18 to 21 are cross-sectional views that are shown according to a process order for describing a method of manufacturing a semiconductor device 100 according to some example embodiments of inventive concepts.

Figure 13:
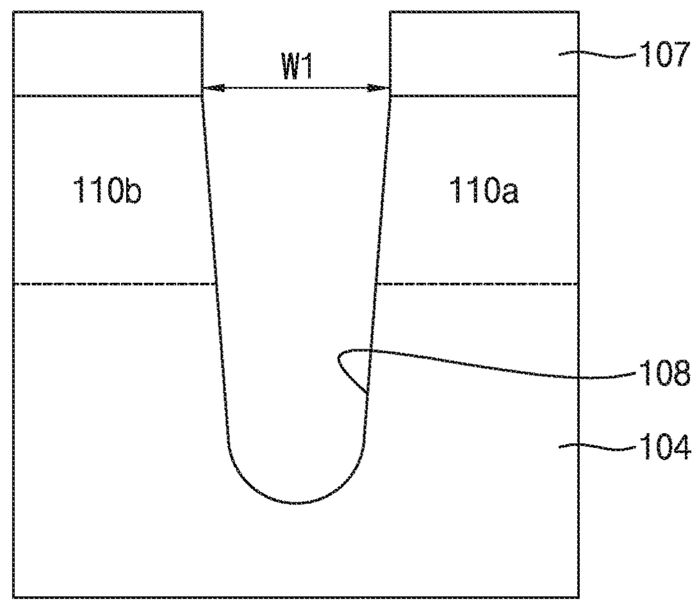
FIGS. 13 to 24 are enlarged views of a method of manufacturing gate trenches used in a semiconductor device, according to some example embodiment of inventive concepts.

Referring to FIG. 13, a mask pattern 107 may be formed on an upper surface of a substrate 102. The mask pattern 107 may expose impurity regions 110*a* and 110*b* to be etched. A gate trench 108 may be formed by etching an active region 104, the impurity regions 110*a* and 110*b*, and a device isolation layer 106 (see FIG. 2) along the mask pattern 107. The gate trench 108 may have a shape extending in the X-axis direction. The mask pattern 107 may include silicon oxide, silicon nitride, or a combination thereof, and may be formed as a single layer or multiple layers. The mask pattern 107 may be formed with a deep ultraviolet (DUV) photolithography process, using a wavelength of light less than or equal to 248 nm. The mask pattern 107 may be formed with an immersion lithography process. The mask pattern 107 may be formed with a double patterning technology (DPT) or a quadruple patterning technology (QPT); however, inventive concepts are not limited thereto. A horizontal width W1 of an upper end of the gate trench 108 may range from 28.5 to 31.5 nm. When the horizontal width is less than 28.5 nm, a gate electrode 124 may not fill the gate trench 108 sufficiently, and thus gate resistance may be increased. When the horizontal width is greater than 31.5 nm, a gap between the impurity regions 110*a* and 110*b* become narrower, and thus a leakage current may be increased, reducing the refresh time of the semiconductor device.

Figure 14:
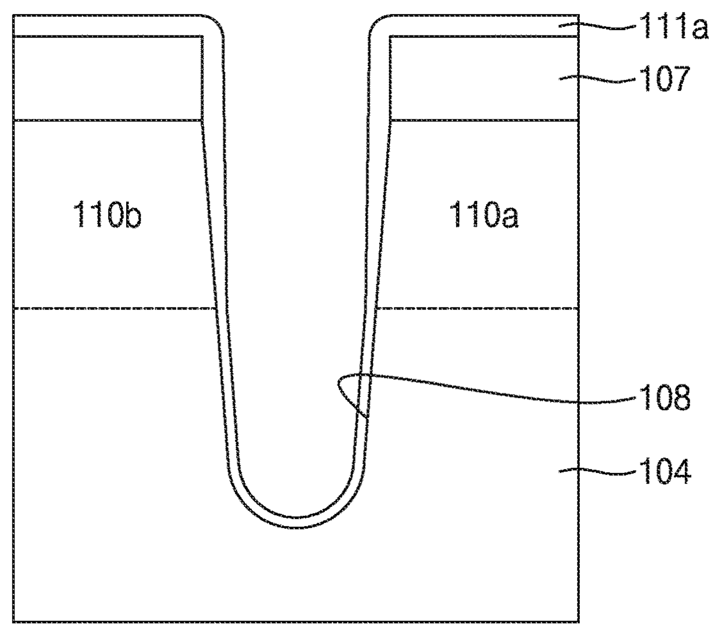

Referring to FIG. 14, an insulating layer 111*a* may be deposited on surfaces of the mask pattern 107 and the gate trench 108. The insulating layer 111*a* may be formed by a process such as a CVD process, an ALD process, a plasma enhanced ALD (PEALD) process, and/or the like. In some example embodiments, the insulating layer 111*a* may be deposited by a CVD process. A thickness of the insulating layer 111*a* at a lower portion of the gate trench 108 may be less than a thickness of the insulating layer 111*a* at an upper portion of the gate trench 108. For example, the insulating layer 111*a* may become thinner starting from the upper portion of the gate trench 108 to the lower portion of the gate trench 108. The thickness of the deposited insulating layer 111*a* may range from 20, e.g. near the bottom of the gate trench 108, to 30 Å, e.g. near the top of the gate trench 108.

Figure 15:
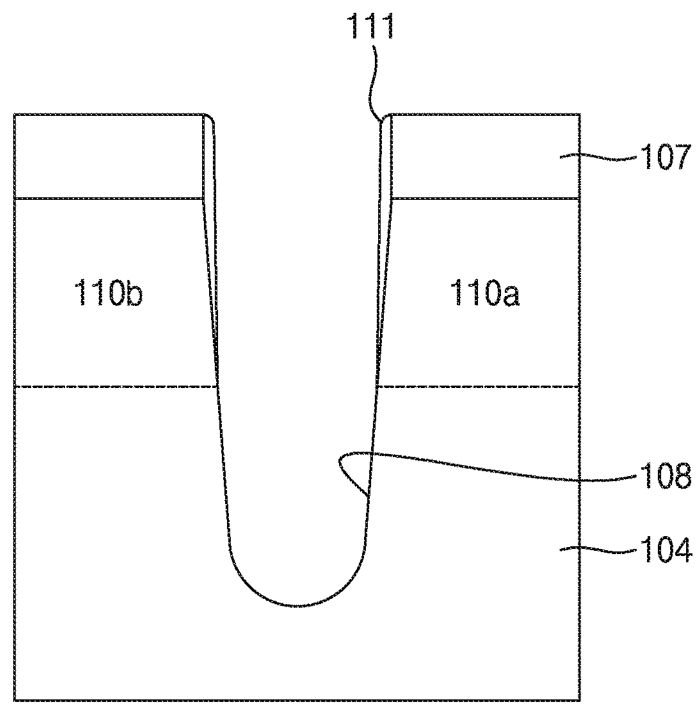

Referring to FIG. 15, a portion of the insulating layer 111*a* may be etched. The insulating layer 111*a* may be removed by a wet etching process, e.g. a wet etching process using a buffered hydrogen fluoride (BHF), or a dry etching process. For example, a reactive ion etching (RIE) process may be used. Since the thickness of the insulating layer 111*a* at the lower portion of the gate trench 108 is less than the thickness of the insulating layer 111*a* at the upper portion of the gate trench 108, the insulating layer 111*a* at the lower portion of the gate trench 108 may be completely removed. An insulating layer 111 remaining after the portion of the insulating layer 111*a* is removed may be positioned in an upper region 108*a* of the gate trench 108.

Figure 16:
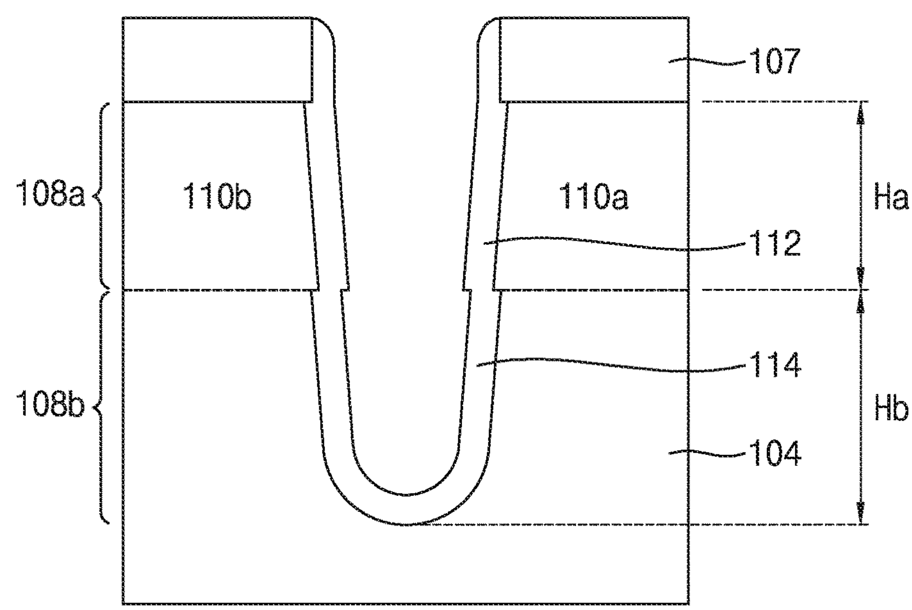

Referring to FIG. 16, an upper gate insulating layer 112 and a lower gate insulating layer 114 may be formed. The upper gate insulating layer 112 and the lower gate insulating layer 114 may be formed by an oxidation process by which silicon contained in the substrate 102 is oxidized. Referring to FIG. 2, the upper gate insulating layer 112 and the lower gate insulating layer 114 may be formed in the active region 104 of the substrate 102. The upper gate insulating layer 112 and the lower gate insulating layer 114 may not be formed inside the device isolation layer 106 not containing silicon.

In some example embodiments, the oxidation process may be an ISSG oxidation process. The ISSG oxidation process is a process of inducing a radical oxidation reaction by loading a semiconductor substrate into a heat treatment chamber and then supplying a hydrogen-containing gas and an oxygen-containing gas into the heat treatment chamber. The hydrogen-containing gas may include a $H_2$ gas, a $CH_4$ gas, or an $NH_3$ gas. The oxygen-containing gas may include $O_2$ or $N_2O$. Since a radical oxidation process forms an oxide film at a low temperature, thermal stress is low. Further, since reactivity of radical oxygen has a dominant influence on the growth of the oxide film, a uniform growth rate of silicon oxide may be exhibited, regardless of a crystal orientation.

The upper gate insulating layer 112 and the lower gate insulating layer 114 may be formed inside the gate trench 108 by an oxidation process. A diameter of an inner circumference of an upper end of the lower gate insulating layer 114 may be greater than a diameter of an inner circumference of a lower end of the upper gate insulating layer 112. An outer diameter of the upper end of the lower gate insulating layer 114 may be greater than an outer diameter of the lower end of the upper gate insulating layer 112. A step may be formed between an inner side of the upper gate insulating layer 112 and an inner side of the lower gate insulating layer 114. Further, a step may be formed between an outer side of the upper gate insulating layer 112 and an outer side of the lower gate insulating layer 114. A thickness of the lower gate insulating layer 114 may range from 70 to 80 Å. A ratio of a height of the lower gate insulating layer 114 to a height of the upper gate insulating layer 112 may range from 1:0.95 to 1:0.98. When the ratio is smaller than 1:0.95, the gate electrode 124 may not fill the inner side of the gate trench 108 sufficiently, and thus gate resistance may be increased. Further, when the ratio is greater than 1:0.98, a distance between the gate electrode 124 and each of the impurity regions **110*a* and 110*b*** may be reduced, and thus a GIDL current may be increased.

Figure 17:
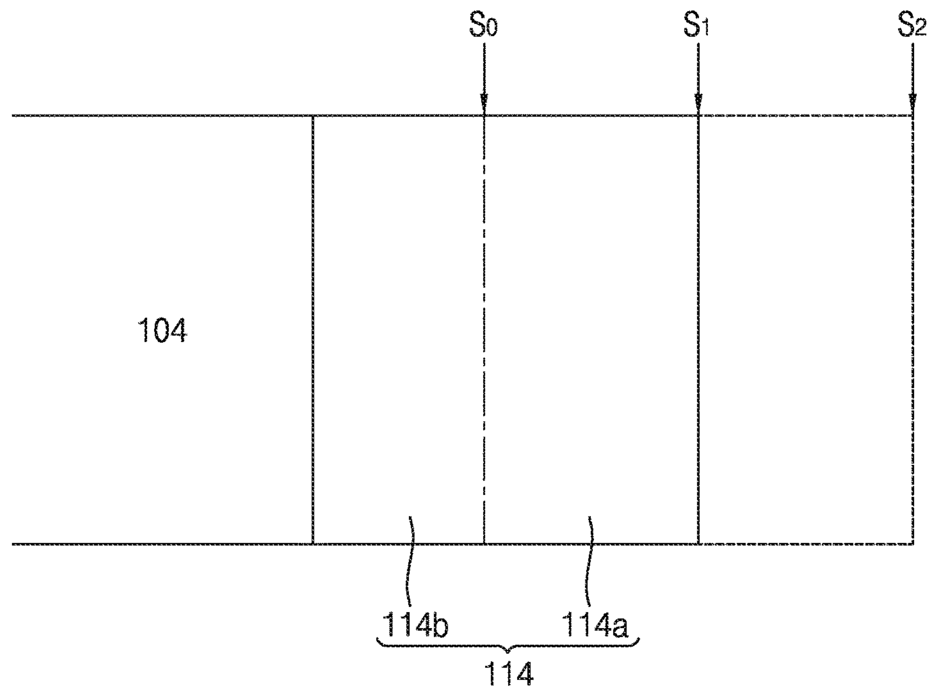

FIG. 17 is a conceptual view for describing a lower gate insulating layer according to an example embodiment of inventive concepts.

FIG. 17 shows that an oxide is formed by an oxidation process on a surface of a gate trench 108 formed in an active region 104. A surface $S_0$ represents the surface of the gate trench 108 before being oxidized, a surface $S_1$ represents a surface of a lower gate insulating layer 114 formed by the oxidation process, and a surface $S_2$ represents a surface of silicon oxide when silicon oxide is deposited on the gate trench 108. In FIG. 17, the oxide is shown to be deposited in the right direction. The lower gate insulating layer 114 may include an outer oxide **114*a* and an inner oxide 114*b*. The outer oxide 114*a* may be formed in an outer direction of the gate trench 108, and the inner oxide 114*b* may be formed in an inner direction of the gate trench 108. The outer oxide 114*a* may be formed thicker than the inner oxide 114*b*, and a ratio of a horizontal width of the inner oxide 114*b* to a horizontal width of the outer oxide 114*a* may be, for example, a ratio of 54:46. The surface $S_1$ may be positioned closer to the surface $S_0$ than the surface $S_2$. For example, in the case in which the gate trench 108 is formed by the oxidation process, an inner space of a lower region 108*b* of the gate trench 108 may be widened as compared with the case in which the gate trench 108 is formed by depositing silicon oxide. The horizontal width of the gate trench 108 may be increased by about 1 to 2 nm by the oxidation process. Since the inner space is widened, the number of the gate electrodes 124** to be filled increases, and thus an increase in gate resistance may be prevented or reduced in likelihood of occurring.

Figure 18:
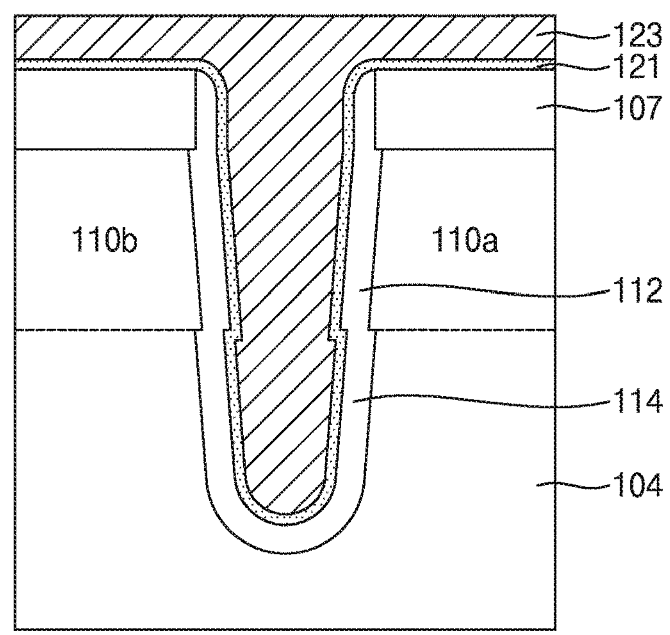

Referring to FIG. 18, a first gate barrier layer 121 and a gate electrode 123 may fill the inner side of the gate trench 108. The first gate barrier layer 121 may be conformally formed on the surface of the gate trench 108. The gate electrode 123 may be formed on the first gate barrier layer 121 to fill the remaining space in the gate trench 108. The first gate barrier layer 121 and the gate electrode 123 may be formed by a CVD process and/or an ALD process.

Figure 19:
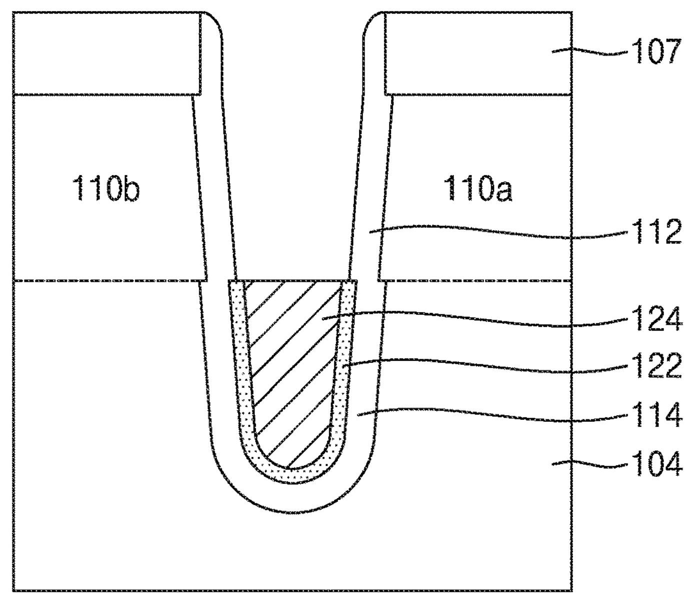

Referring to FIG. 19, the first gate barrier layer 121 and the gate electrode 123 may be recessed. In some example embodiments, a recessing process may be performed by an etch-back process, and in some example embodiments, a planarization process, such as a chemical mechanical planarization (CMP) process, may be performed before a recessing process is performed. The recessed upper end of the first gate barrier layer 122 and the recessed upper surface of the gate electrode 124 may be positioned at the same level. The first gate barrier layer 122 may be disposed in the lower region **108*b* of the gate trench 108, and in some example embodiments, a portion of the first gate barrier layer 122 may be disposed in the upper region 108*a* of the gate trench 108. The gate electrode 124 may be disposed in the lower region 108*b* of the gate trench 108**.

The first gate barrier layer 122 may include titanium nitride (TiN) or tantalum nitride (TaN). The gate electrode 124 may include a metal tungsten and/or copper.

The etch-back process may include a wet etching process. In the wet etching process, an etching solution including a first etchant which mainly removes the gate electrode 124 and a second etchant which mainly removes the first gate barrier layer 122 may be used. For example, the wet etching process may include performing a first etching process in which an etching solution including the first etchant is used and then consecutively performing a second etching process in which an etching solution including the second etchant is used. The first etchant may include water, hydrogen peroxide ($H_2O_2$) and/or ammonium ($NH_4$). The second etchant may include water, sulfuric acid ($H_2SO_4$), hydrogen peroxide ($H_2O_2$) and/or ammonium ($NH_4$).

Figure 20:
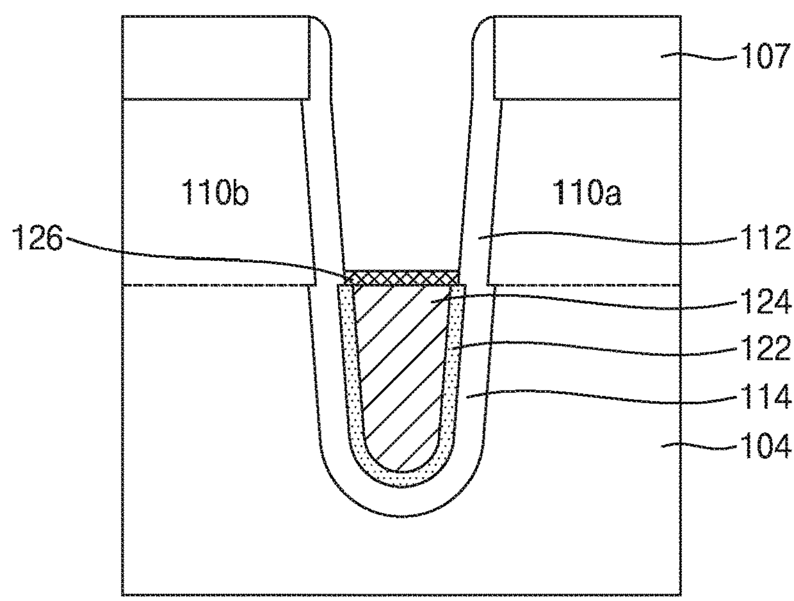

Referring to FIG. 20, a second gate barrier layer 126 may be formed on the gate electrode 124. The second gate barrier layer 126 may be disposed in the upper region **108*a* of the gate trench 108, and a portion of the second gate barrier layer 126 may be in contact with the first gate barrier layer 122. The second gate barrier layer 126 may be deposited on the gate electrode 124 and then may be formed by being etched by a recessing process. In some example embodiments, the second gate barrier layer 126 may be formed by implanting ions, such as nitrogen ions, into the upper surface of the gate electrode 124. In some example embodiments, after the gate electrode 124 is formed such that a portion of the gate electrode 124 is positioned in the upper region 108*a* of the gate trench 108, the second gate barrier layer 126 may be formed by implanting ions into a portion of the gate electrode 124 positioned in the upper region 108*a* of the gate trench 108. The first gate barrier layer 122** may include titanium nitride (TiN), tantalum nitride (TaN), or tungsten nitride (WN).

Figure 21:
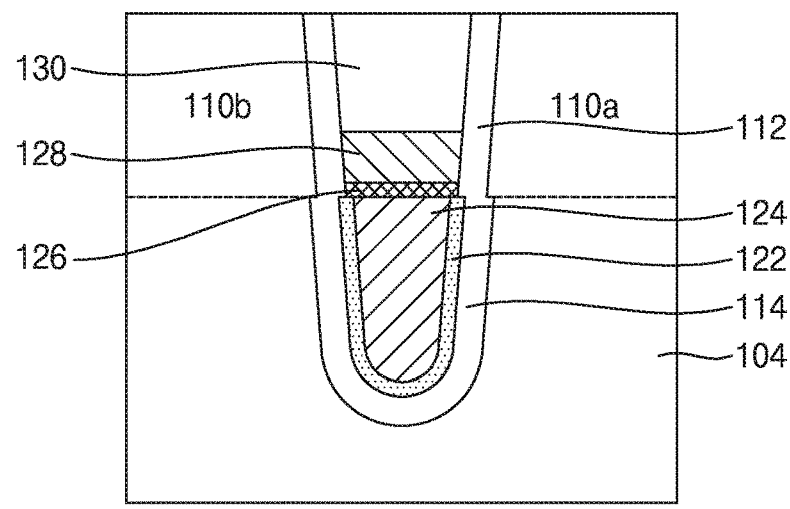

Referring to FIG. 21, a gate buried portion 128 and a gate capping layer 130 may be formed on the second gate barrier layer 126. The gate buried portion 128 and the gate capping layer 130 may be formed by a CVD process and/or an ALD process, and may be disposed in the upper region 108*a* of the gate trench 108. The second gate barrier layer 126 may be recessed such that an upper surface of the second gate barrier layer 126 is positioned at a lower level than an upper end of the gate trench 108 after being deposited. The gate capping layer 130 may be deposited on the gate buried portion 128 to fill the gate trench 108 fully. An upper surface of the gate capping layer 130 may be positioned at the same level as the upper end of the gate trench 108 by a planarization process such as a CMP process. The gate buried portion 128 may include a material having a low work function, and may include, for example, n+ doped polysilicon. The gate capping layer 130 may include silicon nitride, silicon oxynitride, silicon oxide, silicon carbonitride, silicon oxycarbonitride, or a combination thereof.

As shown in FIGS. 13 to 16 and 18 to 21, the process of forming the gate electrode 124 may widen the lower region 108*b* of the gate trench 108 filled with the gate electrode 124 and thus an increase in gate resistance may be prevented. According to the above-described method, since mainly only the lower region 108*b* of the gate trench 108 is widened, the gate electrode 124 may be improved even when an existing design rule is applied.

Figure 22:
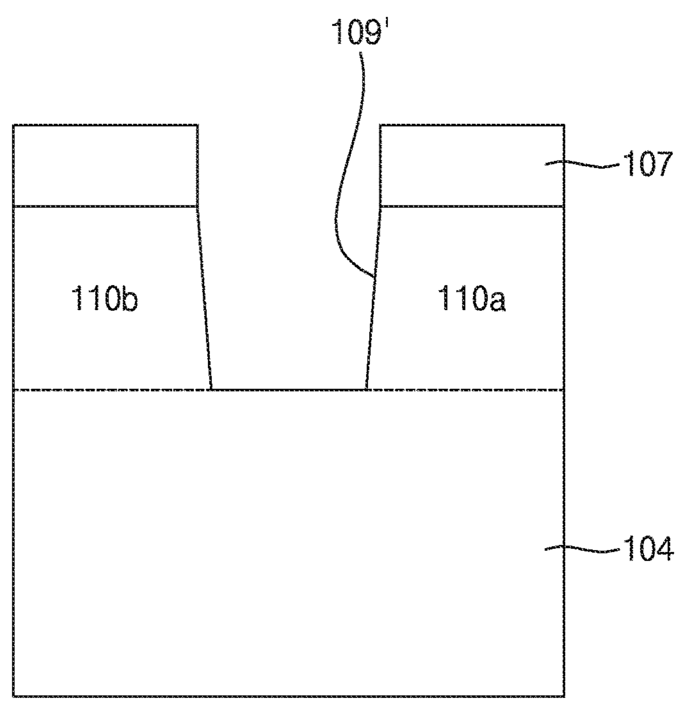
Figure 23:
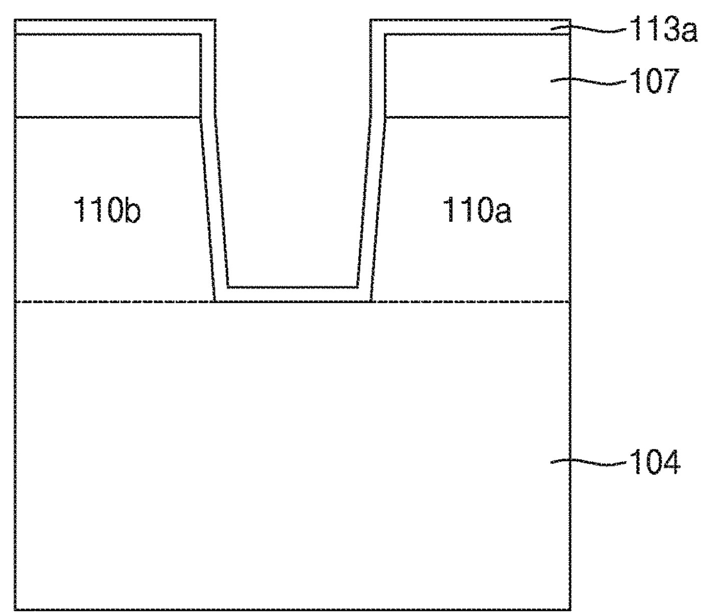
Figure 24:
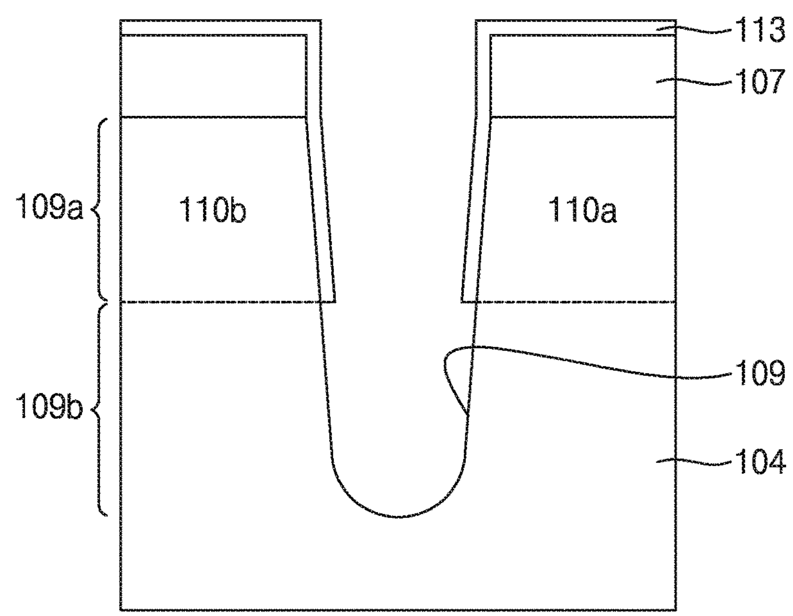

FIGS. 22 to 24 are cross-sectional views that are shown according to a process order for describing a method of manufacturing a semiconductor device according to some example embodiments of inventive concepts.

Referring to FIGS. 13 and 22, a mask pattern 107 may be formed on an upper surface of a substrate 102. The mask pattern 107 may expose impurity regions 110*a* and 110*b* to be etched. A gate trench 108 may be formed at a predetermined depth from the upper surface of the substrate 102.

Referring to FIG. 23, an insulating layer 113*a* may be formed on an upper surface and side surfaces of the mask pattern 107 and an inner wall of the gate trench 108. The insulating layer 113*a* may include silicon oxide. The insulating layer 113*a* may be deposited by a process such as a CVD process and/or an ALD process, and/or the like.

Referring to FIG. 24, the substrate 102 may be etched again to form the gate trench 108. First, a portion of the insulating layer 113*a* may be removed by an etching process to form an insulating layer 113. The insulating layer 113 may be positioned at a sidewall of the gate trench 108. Thereafter, an upper gate insulating layer 112 and a lower gate insulating layer 114 may be formed by a silicon oxidation process, as described above with reference to FIG. 16. As shown in FIGS. 22 to 24, the gate trench 108 may be formed by performing the etching process two times, and thus a height of the upper gate insulating layer 112 may be easily controlled.

According to example embodiments of inventive concepts, an inner diameter of a lower end of a lower gate insulating layer is greater than an inner diameter of a lower end of an upper gate insulating layer, and thus a space filled with a gate electrode is widened. Accordingly, an increase in gate resistance can be prevented or reduced in likelihood of occurrence.

While the embodiments of inventive concepts have been described with reference to the accompanying drawings, it should be understood by those of ordinary skill in the art that various modifications may be made without departing from the scope of inventive concepts and without changing essential features thereof. Therefore, the above-described embodiments should be considered in a descriptive sense only and not for purposes of limitation.

What is claimed is:

1. A semiconductor device comprising:

a substrate comprising an upper surface;

a gate trench on the upper surface of the substrate, the gate trench including an upper region and a lower region, the upper region of the gate trench including a first inner surface, the lower region of the gate trench including a second inner surface and a lower surface;

an upper gate insulating layer on the first inner surface;

a lower gate insulating layer on the second inner surface and the lower surface, the lower gate insulating layer connected to the upper gate insulating layer;

a first gate barrier layer on a first inner side of the lower gate insulating layer;

a gate electrode on a second inner side of the first gate barrier layer, the gate electrode filling the lower region of the gate trench; and a gate buried portion on the gate electrode, wherein a diameter of an inner circumference of an upper end of the lower gate insulating layer is greater than a diameter of an inner circumference of a lower end of the upper gate insulating layer.

2. The semiconductor device of claim 1, wherein a diameter of an outer circumference of the upper end of the lower gate insulating layer is greater than a diameter of an outer circumference of the lower end of the upper gate insulating layer.

3. The semiconductor device of claim 1, wherein a step is between the first inner side of the upper gate insulating layer and the second inner side of the lower gate insulating layer.

4. The semiconductor device of claim 1, wherein the gate buried portion includes doped polysilicon.

5. The semiconductor device of claim 1, wherein a ratio of a height of the lower gate insulating layer to a height of the upper gate insulating layer ranges from 1:0.95 to 1:0.98.

6. The semiconductor device of claim 1, further comprising:

a second gate barrier layer between the gate buried portion and the gate electrode, the second gate barrier layer covering at least a portion of a lower surface of the gate buried portion.

7. The semiconductor device of claim 6, wherein, the gate electrode includes tungsten, and the second gate barrier layer includes tungsten nitride.

8. The semiconductor device of claim 6, wherein, a lower surface of the second gate barrier layer is at a same level as the lower end of the upper gate insulating layer, and the second gate barrier layer is in contact with an inner wall of the upper gate insulating layer.

9. The semiconductor device of claim 6, further comprising:

a work function adjusting layer configured to cover a side surface of the gate buried portion, wherein an upper end of the work function adjusting layer is at the same level as an upper surface of the gate buried portion, and a lower end of the work function adjusting layer is in contact with the second gate barrier layer.

10. The semiconductor device of claim 6, wherein, an upper surface of the second gate barrier layer is at the same level as the upper end of the lower gate insulating layer, and the second gate barrier layer is in contact with an inner wall of the first gate barrier layer.

11. The semiconductor device of claim 6, wherein, the first gate barrier layer includes a protrusion configured to protrude toward an inner side of the gate trench, the protrusion being formed at an upper end of the first gate barrier layer; and an upper surface of the second gate barrier layer and an upper surface of the protrusion are positioned at the same level in the upper region of the gate trench.

12. The semiconductor device of claim 6, wherein, the first gate barrier layer includes a protrusion configured to protrude toward an inner side of the gate trench, the protrusion being formed at an upper end of the first gate barrier layer, an upper surface of the protrusion is positioned at a same level as the upper end of the lower gate insulating layer, and an upper surface of the second gate barrier layer is positioned at the same level as the upper surface of the protrusion.

13. A semiconductor device comprising:

a substrate comprising an upper surface;

a gate trench on the upper surface of the substrate, the gate trench including an upper region and a lower region, the upper region including a first inner surface, the lower region including a second inner surface;

an upper gate insulating layer on the first inner surface of the upper region of the gate trench;

a lower gate insulating layer on a) the second inner surface of the lower region of the gate trench and b) a lower surface of the lower region of the gate trench, the lower gate insulating layer connected to the upper gate insulating layer;

a first gate barrier layer on an inner side of the lower gate insulating layer;

a gate electrode on an inner side of the first gate barrier layer, the gate electrode filling the lower region of the gate trench; and a gate buried portion on the gate electrode, wherein a diameter of an outer circumference of an upper end of the first gate barrier layer is greater than a diameter of a lower surface of the gate buried portion.

14. The semiconductor device of claim 13, wherein the gate buried portion includes doped polysilicon.

15. The semiconductor device of claim 13, further comprising:

a second gate barrier layer between the gate buried portion and the gate electrode, the second gate barrier layer configured to cover at least a portion of the lower surface of the gate buried portion.

16. The semiconductor device of claim 15, wherein, a lower surface of the second gate barrier layer is at the same level as a lower end of the upper gate insulating layer, and the second gate barrier layer is in contact with an inner wall of the upper gate insulating layer.

17. The semiconductor device of claim 15, wherein, the first gate barrier layer includes a protrusion configured to protrude toward an inner side of the gate trench, the protrusion being formed at an upper end of the first gate barrier layer, an upper surface of the protrusion is at the same level as an upper end of the lower gate insulating layer, and an upper surface of the second gate barrier layer is at the same level as the upper surface of the protrusion.

18. A semiconductor device comprising:

a substrate comprising an active region;

a gate trench configured to extend in one direction on an upper surface of the substrate;

an upper gate insulating layer on an inner surface of an upper region of the gate trench;

a lower gate insulating layer on a) an inner surface of a lower region of the gate trench and b) a lower surface of a lower region of the gate trench, the lower gate insulating layer connected to the upper gate insulating layer;

a first gate barrier layer on an inner side of the lower gate insulating layer;

a gate electrode on an inner side of the first gate barrier layer, the gate electrode configured to fill the lower region of the gate trench;

a second gate barrier layer; and a gate buried portion, the second gate barrier layer and the gate buried portion being sequentially stacked on the gate electrode, wherein the upper gate insulating layer and the lower gate insulating layer are in the active region, an upper end of the first gate barrier layer is positioned at the same level as an upper surface of the gate electrode, a lower surface of the second gate barrier layer is positioned at the same level as a lower end of the lower gate insulating layer are positioned, and a diameter of an inner circumference of an upper end of the lower gate insulating layer is greater than a diameter of an inner circumference of a lower end of the upper gate insulating layer.

19. The semiconductor device of claim 18, wherein the gate buried portion includes doped polysilicon.

20. The semiconductor device of claim 18, further comprising:

a work function adjusting layer covering a side surface of the gate buried portion.

* * * * *